(12) United States Patent
Shu

(10) Patent No.: US 6,384,652 B1
(45) Date of Patent: May 7, 2002

(54) CLOCK DUTY CYCLE CORRECTION CIRCUIT

(75) Inventor: Tzi-Hsiung Shu, San Jose, CA (US)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/640,533

(22) Filed: Aug. 17, 2000

(51) Int. Cl.[7] ............................................. H03K 3/017
(52) U.S. Cl. ...................... 327/175; 327/165; 327/170; 331/177 R
(58) Field of Search ................................ 327/175, 172, 327/173, 174, 176, 170, 291, 292, 299, 165, 166, 131, 113, 114, 31, 35, 36, 37, 124; 331/40, 41, 177 R

(56) References Cited

U.S. PATENT DOCUMENTS

| 5,614,855 A | 3/1997 | Lee et al. .................... 327/158 |
| 5,757,218 A | 5/1998 | Blum .......................... 327/175 |
| 5,945,862 A | 8/1999 | Donnelly et al. ............ 327/278 |
| 6,198,322 B1 * | 3/2001 | Yoshimura .................. 327/175 |

OTHER PUBLICATIONS

T. H. Lee et al., "A 2.5 V CMOS Delay–Locked Loop for 18 Mbit, 500 Megabyte/s DRAM", IEEE Journal of Solid-–State Circuits, vol. 29, No. 12, Dec. 1994, pp. 1491–1496.

B.W. Garleep et al., "A Portable Digital DLL for High–Speed CMOS Interface Circuits", IEEE Journal of Solid–State Circuits, pp. 632–644, May 1999, vol. 34, No. 5.

T.H. Lee et al., "A 2.5 V Delay–Locked Loop for an 18 Mb 500 MB/s DRAM", IEEE International Solid–State Circuits Conference, Jul. 1994, pp. 300–301.

* cited by examiner

Primary Examiner—Terry D. Cunningham
Assistant Examiner—Minh Nguyen
(74) Attorney, Agent, or Firm—George O. Saile; Stephen B. Ackerman; Larry J. Prescott

(57) ABSTRACT

A duty cycle correcting circuit is described having a first capacitor connected between a first node and a reference node and a second capacitor connected between a second node and the reference node. When the duty cycle of the output clock signal is greater than 50% the voltage across the second capacitor decreases thereby increasing the charging rate of the first capacitor, decreasing the discharging rate of the first capacitor, and restoring the output duty cycle to 50%. When the duty cycle of the output clock signal is less than 50% the voltage across the second capacitor increases thereby decreasing the charging rate of the first capacitor, increasing the discharging rate of the first capacitor, any restoring output duty cycle to 50%.

18 Claims, 4 Drawing Sheets

CLOCK DUTY CYCLE CORRECTION CIRCUIT

BACKGROUND OF THE INVENTION (1) Field of the Invention

This invention relates to a circuit for correcting the duty cycle of a clock signal and more specifically to a circuit which converts a clock signal having a duty cycle of other than 50% to a 50% duty cycle.

(2) Description of the Related Art

Two aspects of a clock signal that are of key importance in many circuit applications are the clock frequency and the clock duty cycle. The clock duty cycle can become distorted through circuit interaction and circuits which can restore the duty cycle to a desired level are of significant importance.

U.S. Pat. No. 5,614,855 to Lee, et al. describes a delay locked loop, DLL, in which a phase detector compares the phase of the output of the DLL with that of a reference input. The output of the phase comparator drives a differential charge pump which functions to integrate the phase comparator output signal over time. The charge pump output controls a phase shifter with unlimited range that adjusts the phase of the DLL output so that the output of the phase comparator is high 50% of the time on average. Duty cycle correcting amplifiers are employed to produce a DLL output clock that has a desired duty cycle, such as 50%.

U.S. Pat. No. 5,757,218 to Blum describes a duty cycle correction circuit that facilitates correction of clock signal duty cycles, including correcting for errors introduced by intervening devices in the clock signal distribution network. The duty cycle correction circuit has a clock chopper circuit, a duty cycle comparator circuit, and a control circuit. The duty cycle comparator circuit compares the duty cycle of the clock signal with the duty cycle of a reference signal. The control circuit adjusts the clock chopper circuit based upon the duty cycle comparison, resulting in an output with a corrected duty cycle.

U.S. Pat. No. 5,945,862 to Donnelly, et al. describes circuitry for the delay adjustment of a clock signal. The circuitry performs duty cycle correction of the input clock and the selected output clock.

A paper entitled "A Portable Digital DLL For High-Speed CMOS Interface Circuits" by B. W. Garlepp, et al., IEEE Journal of Solid-State Circuits, pp. 632–644, May 1999, Vol. 34, No. 5, describes a digital delay-locked loop, DLL, that achieves infinite phase range and 40 picosecond worst case phase resolution at 400 MHz which was developed in a 3.3 volt, 0.4 micron standard CMOS process. The DLL uses dual delay lines with an end-of-cycle detector, phase blenders, and duty cycle correcting multiplexers.

A paper entitled "A 2.5 V CMOS Delay-Locked Loop for 18 Mbit, 500 Megabyte/s DRAM", by T. H. Lee, et al., IEEE Journal of Solid-State Circuits, Vol. 29, No. 12, December 1994, pages 1491–1496 describes clock recovery circuits specifically designed for a hostile noise environment. These circuits implement a delay-locked loop thereby achieving low jitter and reduced sensitivity to noise on the substrate and the power supply rails. Differential signals are employed in signal and control paths to decrease noise sensitivity. Minor loops, enclosed within the overall loop feedback path, perform active duty cycle correction.

A paper entitled "A 2.5 V Delay-Locked Loop for an 18 Mb 500 MB/s DRAM", by T. H. Lee, et al., IEEE International Solid-State Circuits Conference, July 1994, pp. 300–301 describes a pair of delay-locked loops, DLL, one for transmitting data and one for receiving data. The pair of DLL circuits provide accurate timing in the noisy environment of DRAMs to allow data transfer rates exceeding 500 Mb/s/pin at 2.5 volts.

SUMMARY OF THE INVENTION

In many circuit applications, such as switch capacitor circuits, two aspects of the clock signal can have a significant effect on the design and performance of the circuit. These two aspects of the clock signal are the clock frequency and the duty cycle. The clock frequency is usually set by the overall circuit application and not subject to change. The duty cycle of the clock is initially determined by the clock generator. The duty cycle is defined as the ratio of the time the clock pulse is at the high level to the clock period. A clock signal that is at the high level for one half of the clock period and the low level for one half the clock period has a 50% duty cycle. A 50% duty cycle is usually desirable because it makes the most efficient use of the times the clock signal is at the high level and at the low level.

As the clock signal propagates through circuits the clock signal duty cycle can become distorted. A simple circuit to restore the clock signal duty cycle to the desired value, such as 50% is very desirable.

It is a principle objective of this invention to provide a circuit which produces an output clock signal having a 50% duty cycle for an input clock signal having a wide range of duty cycles.

This objective is achieved by a circuit having an input node, an output node, a first node, a second node, and a reference node. A first capacitor is connected between the first node and the reference node. A second capacitor is connected between the second node and the reference node. The input clock signal is fed to the input node and the output clock signal is taken from the output node. When the input clock signal is at the low level the first capacitor is charged at a rate which is inversely proportional to the voltage drop across the second capacitor. When the input clock signal is at the high level the first capacitor is discharged at a rate which is directly proportional to the voltage drop across the second capacitor.

When the voltage drop across the first capacitor exceeds a threshold voltage the voltage at the output node is at the low level. When the voltage drop across the first capacitor is less than the threshold voltage the voltage at the output node is at the high level. When the voltage at the output node is at the low level the second capacitor is charged at a constant rate by a current source. When the voltage at the output node is at the high level the second capacitor is discharged at a constant rate by another current source. The output clock signal is taken from the output node.

The voltage drop across the first capacitor exhibits a sawtooth waveform, increasing when the input clock signal is at the low level and decreasing when the input clock signal is at the high level. The charging rate and the capacitance of the second capacitor are chosen so that the voltage drop across the second capacitor exhibits only slight variations. This circuit produces an output clock signal having a very nearly 50% duty cycle for a wide range of duty cycles for the input clock signal. The circuit and the details of the generation of the output clock signal will be described in greater detail with reference to the drawings.

DESCRIPTION OF THE PREFERRED EMBODIMENTS

Figure 1:
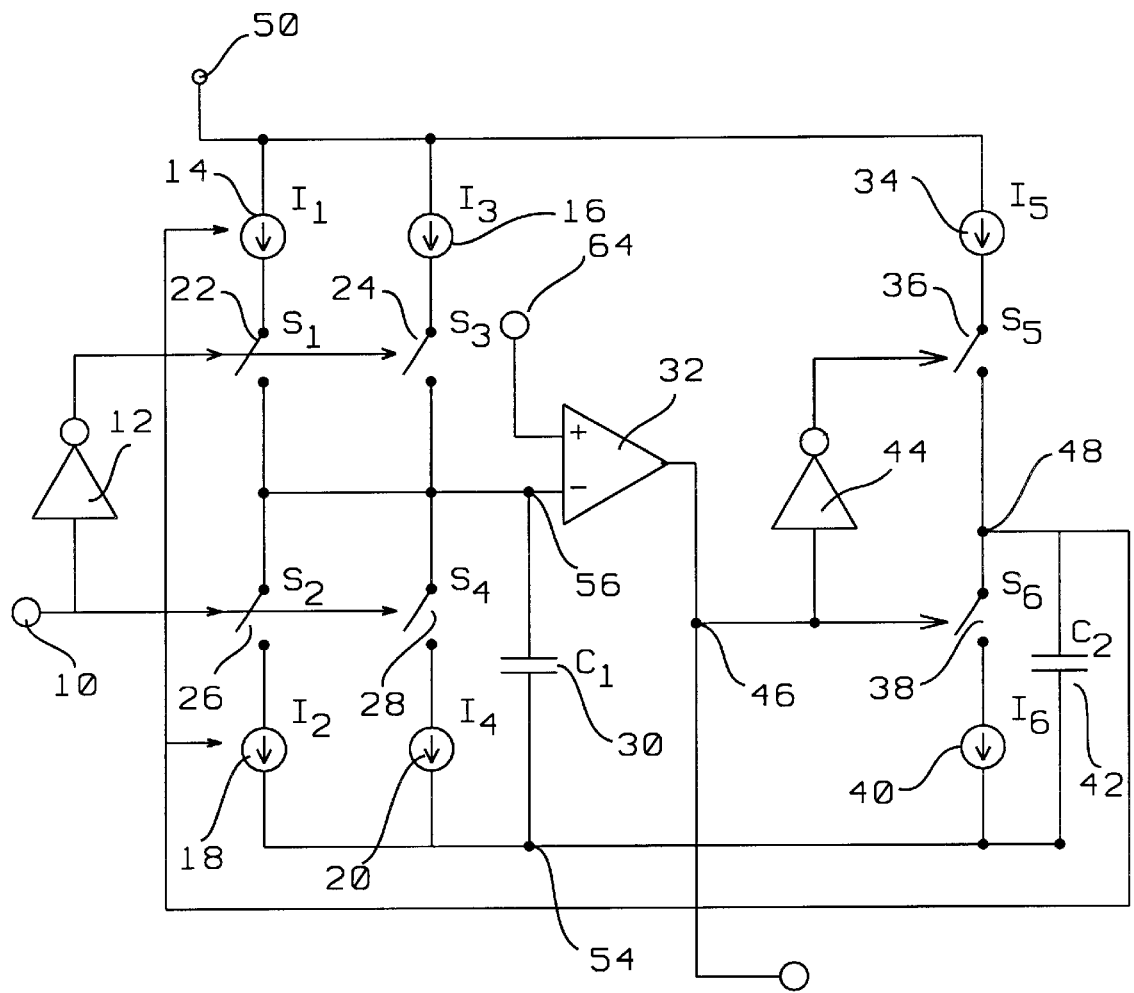
FIG. 1 shows a block diagram of the duty cycle correction circuit of this invention.

The operation of the duty cycle correction circuit of this invention will now be described with reference to FIGS. 1-4. FIG. 1 shows a block diagram of the duty cycle correction circuit of this invention. The circuit shown in FIG. 1 comprises a first switch 22, a second switch 26, a third switch 24, a fourth switch 28, a fifth switch 36, and a sixth switch 38. All of the switches are closed when the voltage to them is at the high level and open when the voltage to them is at the low level. The first switch 22 and the third switch 24 are connected to the input node 10 through an inverter 12 so they are open when the voltage at the input node 10 is at the high level and closed when the voltage at the input node 10 is at the low level. The second switch 26 and the fourth switch 28 are connected directly to the input node 10 so they are closed when the voltage at the input node 10 is at the high level and open when the voltage at the input node 10 is at the low level. The first switch 22, second switch 26, third switch 24, and fourth switch 28 are all connected to a first node 56. A first capacitor 30 is connected between the first node 56 and a reference node 54.

The circuit shown in FIG. 1 further comprises a first current source 14, a second current source 18, a third current source 16, a fourth current source 20, a fifth current source 34, and a sixth current source 40. The first 14 and third 16 current sources are connected to a voltage supply node 50. The second 18 and fourth 20 current sources are connected to the reference node 54. The first current source 14 is coupled to a second node 48 in such a way that the current provided by the first current source 14 decreases as the voltage drop from the second node 48 to the reference node 54 increases, or varies inversely with the voltage drop from the second node 48 to the reference node 54. The second current source 18 is coupled to the second node 48 in such a way that the current provided by the second current source 18 increases as the voltage drop from the second node 48 to the reference node 54 increases, or varies directly with the voltage drop from the second node 48 to the reference node 54. The third current source 16 is a fixed trickle current source and is small compared to the first current source 14. Similarly, the fourth current source 20 is a fixed trickle current source and is small compared to the third current source 18.

Figure 2A:
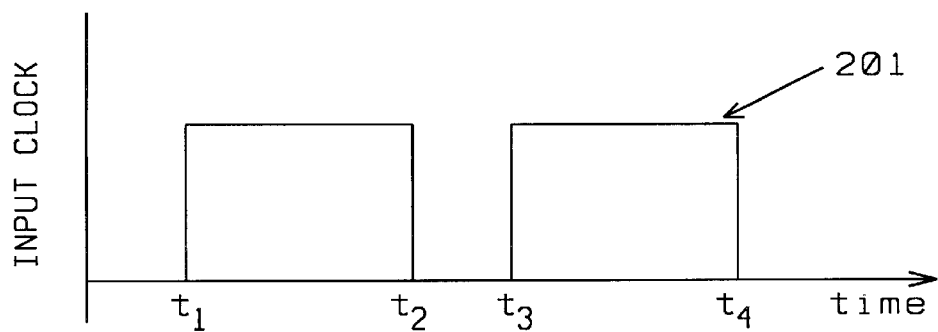
FIG. 2A shows the curve of the input clock signal as a function of time.
Figure 2B:
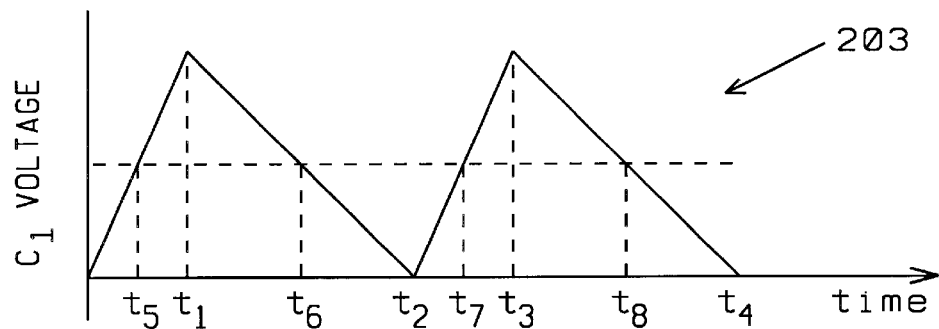
FIG. 2B shows the curve of the voltage drop across the first capacitor as a function of time.

The clock input signal is fed to the input node 10. When the clock input signal is at the low level the first switch 22 and the third switch 24 are closed, the second switch 26 and the fourth switch 28 are open, and the first current source 14 and the third current source 16 charge the first capacitor 30 by pumping charge from the voltage supply node 50 to the first capacitor 30. When the clock input signal is at the high level the second switch 26 and the fourth switch 28 are closed, the first switch 22 and the third switch 24 are open, and the second current source 18 and the fourth current source 20 discharge the first capacitor 30 by pumping charge from the first capacitor 30 to the reference node 54. The value of the first capacitor 30 and the values of the first 14, second 18, third 16, and fourth 20 current sources are chosen so that the voltage drop from the first node 56 to the reference node 54 exhibits a saw tooth waveform. The voltage drop from the first node 56 to the reference node 54 increases when the clock input signal is at the low level and decreases when the clock input signal is at the high level. FIG. 2A shows the input clock signal 201 as a function of time and FIG. 2B shows the voltage drop from the first node 56 to the reference node 54 waveform as a function of time.

Figure 2C:
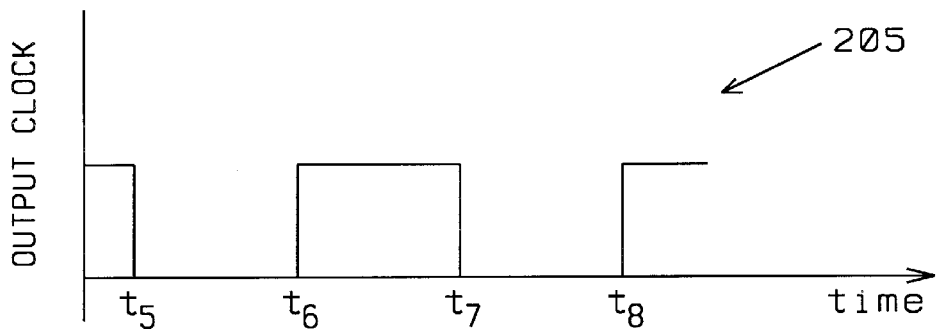
FIG. 2C shows the curve of the output clock signal as a function of time.

As shown in FIG. 1, the first node 56 is connected to one input of a comparator 32. The other input 64 to the comparator 32 is connected to a threshold voltage supply, not shown, which supplies a threshold voltage. The output of the comparator 32 is connected to the output node 46. The output clock signal is taken from the output node 46. When the voltage drop from the first node 56 to the reference node 54 is less than the threshold voltage the output of the comparator 32 holds the voltage at the output node 46 at the high level. When the voltage drop from the first node 56 to the reference node 54 is greater than the threshold voltage the output of the comparator 32 holds the output node at the low level. The voltage waveform 205 at the output node 46, which is the output clock signal, is shown in FIG. 2C.

As shown in FIG. 1, the fifth switch 36 is connected through an inverter 44 to the output node 46 and the sixth switch 38 is connected directly to the output node 46. A second capacitor 42 is connected between the second node 48 and the reference node 54. When the voltage at the output node 46, the clock output signal, is at the low level the fifth switch 36 is closed, the sixth switch 38 is open, and the fifth current source 34 charges the second capacitor 42 by pumping charge from the voltage supply node 50 to the second capacitor 42. When the clock input signal is at the high level the sixth switch 38 is closed, the fifth switch 36 is open, and the sixth current source 40 discharges the second capacitor 42 by pumping charge from the second capacitor 42 to the reference node 54. The fifth 34 and sixth 40 current sources are fixed current sources.

Figure 2D:
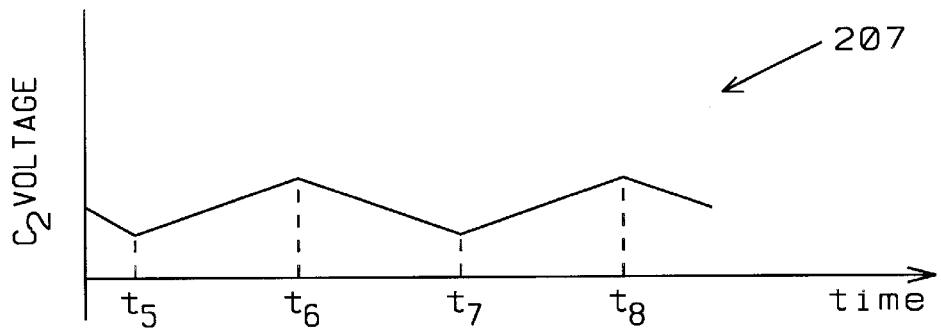
FIG. 2D shows the curve of the voltage drop across the second capacitor as a function of time.

The value of the second capacitor 42 is chosen to be large with respect to the fifth current source 34 and sixth current source 40 so that the voltage drop from the second node 48 to the reference node 54 has only slight variations when the second capacitor 42 is charged and discharged by the fifth 34 and sixth 40 current sources. The waveform 207 of the voltage drop from the second node 48 to the reference node 54 is shown in FIG. 2D.

If initially a clock input signal with a fixed duty cycle produces a clock output signal, appearing at the output node 46, with a duty cycle greater than 50% the second capacitor 42 will be discharged for a longer period of time than it is charged. This will lower the voltage drop from the second node 48 to the reference node 54, which will have the effect of increasing the first current source 14 and decreasing the second current source 18 thereby increasing the charging rate and decreasing the discharging rate of the first capacitor. This will keep the voltage drop from the first node 56 to the reference node 54 above the threshold voltage for a longer time and thereby reduce the duty cycle of the output clock signal appearing at the output node 46 until it reaches the equilibrium state of 50% duty cycle.

If, however, initially a clock input signal with a fixed duty cycle produces a clock output signal, appearing at the output node 46, with a duty cycle less than 50% the second capacitor 42 will be charged for a longer period of time than it is discharged. This will raise the voltage drop from the second node 48 to the reference node 54, which will have the effect of decreasing the first current source 14 and increasing the second current source 18 thereby decreasing the charging rate and increasing the discharging rate of the first capacitor. This will keep the voltage drop from the first node 56 to the reference node 54 above the threshold voltage for a shorter time and thereby increase the duty cycle of the output clock signal appearing at the output node 46 until it reaches the equilibrium state of 50% duty cycle.

Figure 3:
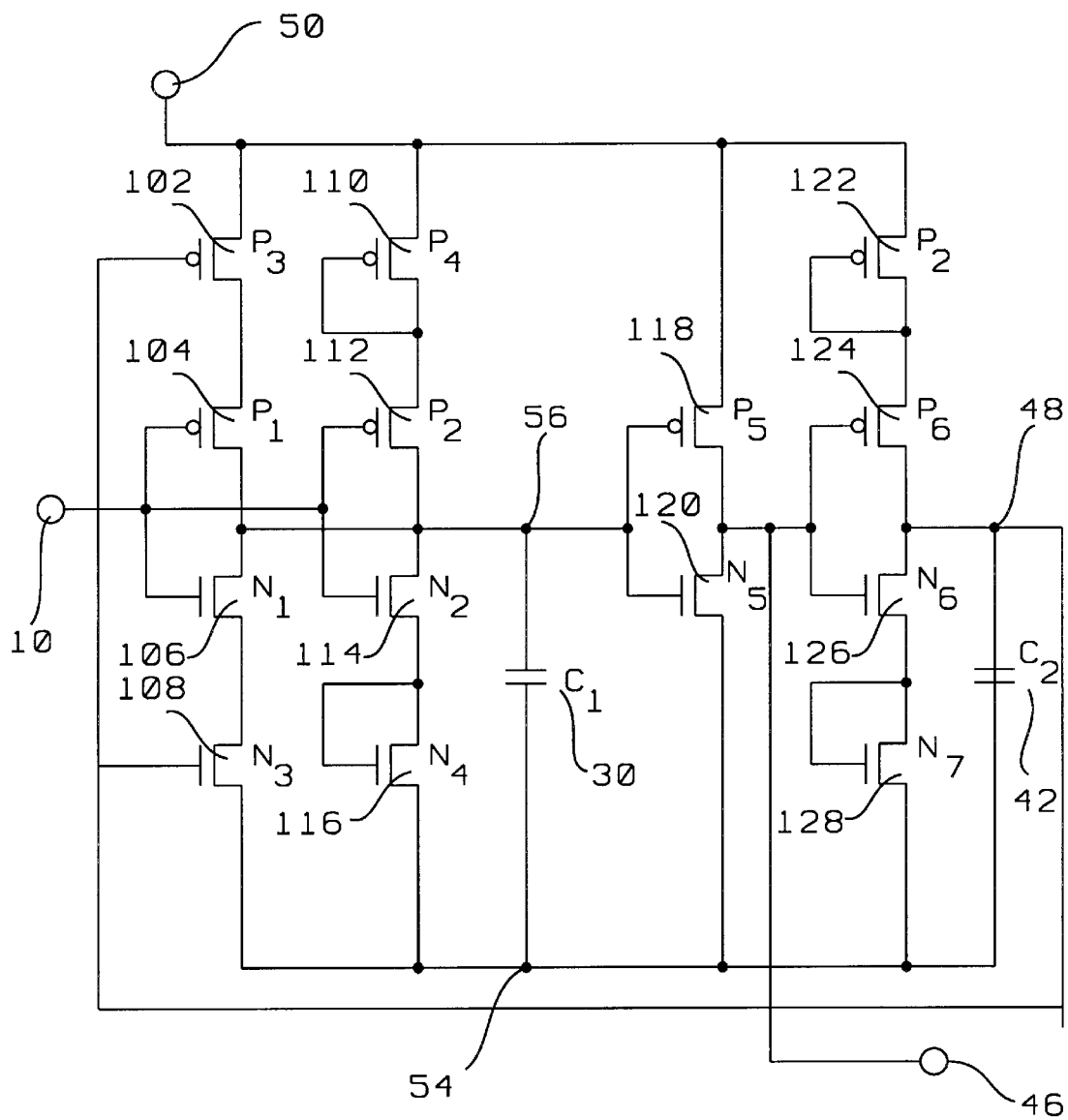
FIG. 3 shows a detailed circuit for the realization of the duty cycle correction circuit of this invention.

One example of a circuit realization of the block diagram of the circuit shown in FIG. 1 is shown in FIG. 3. The first switch is implemented with a first P channel metal oxide semiconductor, PMOS, transistor 104 with its gate connected to the input node 10. The third switch is implemented with a second PMOS transistor 112 with its gate connected to the input node 10. The second switch is implemented with a first N channel metal oxide semiconductor, NMOS, transistor 106 with its gate connected to the input node 10. The fourth switch is implemented with a second NMOS transistor 114 with its gate connected to the input node 10. The use of PMOS and NMOS transistors for the first, second, third, and fourth switches eliminates the need for an inverter, reference number 12 in FIG. 1.

As shown in FIG. 3 the first current source is implemented with a third PMOS transistor 102 and the second current source is implemented with a third NMOS transistor 108 both with their gates connected to the second node 48. The third current source is implemented with a fourth PMOS transistor 110 and the fourth current source implemented with a fourth NMOS transistor 116 both connected in diode mode. The comparator is implemented with an inverter comprising a fifth PMOS transistor 118 and a fifth NMOS transistor 120. The use of an inverter as the comparator eliminates the need for a threshold voltage supply connected to an input of the comparator, shown in FIG. 1 as the node identified by reference number 64, since the intrinsic threshold of the inverter can be used instead.

The fifth switch is implemented with a sixth PMOS transistor 124 with its gate connected to the output node 46. The sixth switch is implemented with a sixth NMOS transistor 126 with its gate connected to the output node 46. The use of PMOS and NMOS transistors for the fifth and sixth switches eliminates the need for an inverter, reference number 44 in FIG. 1. The fifth current source is implemented with a seventh PMOS transistor 122 and the sixth current is source implemented with a seventh NMOS transistor 128 both connected in diode mode.

In the circuit of FIG. 3, if initially a clock input signal with a fixed duty cycle produces a clock output signal, appearing at the output node 46, with a duty cycle greater than 50% the second capacitor 42 will be discharged for a longer period of time than it is charged. This will lower the voltage drop from the second node 48 to the reference node 54, which will have the effect of increasing the current in the third PMOS transistor 102 and decreasing the current in the third NMOS transistor 108 thereby increasing the charging rate and decreasing the discharging rate of the first capacitor 30. This will keep the voltage drop from the first node 56 to the reference node 54 above the threshold voltage of the inverter comprising the fifth PMOS transistor 118 and fifth NMOS transistor 120 for a longer time and thereby reduce the duty cycle of the output clock signal appearing at the output node 46 until it reaches the equilibrium state of 50% duty cycle.

If, however, initially a clock input signal with a fixed duty cycle produces a clock output signal, appearing at the output node 46, with a duty cycle less than 50% the second capacitor 42 will be charged for a longer period of time than it is discharged. This will raise the voltage drop from the second node 48 to the reference node 54, which will have the effect of decreasing the current in the third PMOS transistor 102 and increasing the current in the third NMOS transistor 108 thereby decreasing the charging rate and increasing the discharging rate of the first capacitor 30. This will keep the voltage drop from the first node 56 to the reference node 54 above the threshold voltage of the inverter comprising the fifth PMOS transistor 118 and fifth NMOS transistor 120 for a shorter time and thereby increase the duty cycle of the output clock signal appearing at the output node 46 until it reaches the equilibrium state of 50% duty cycle.

Figure 4:
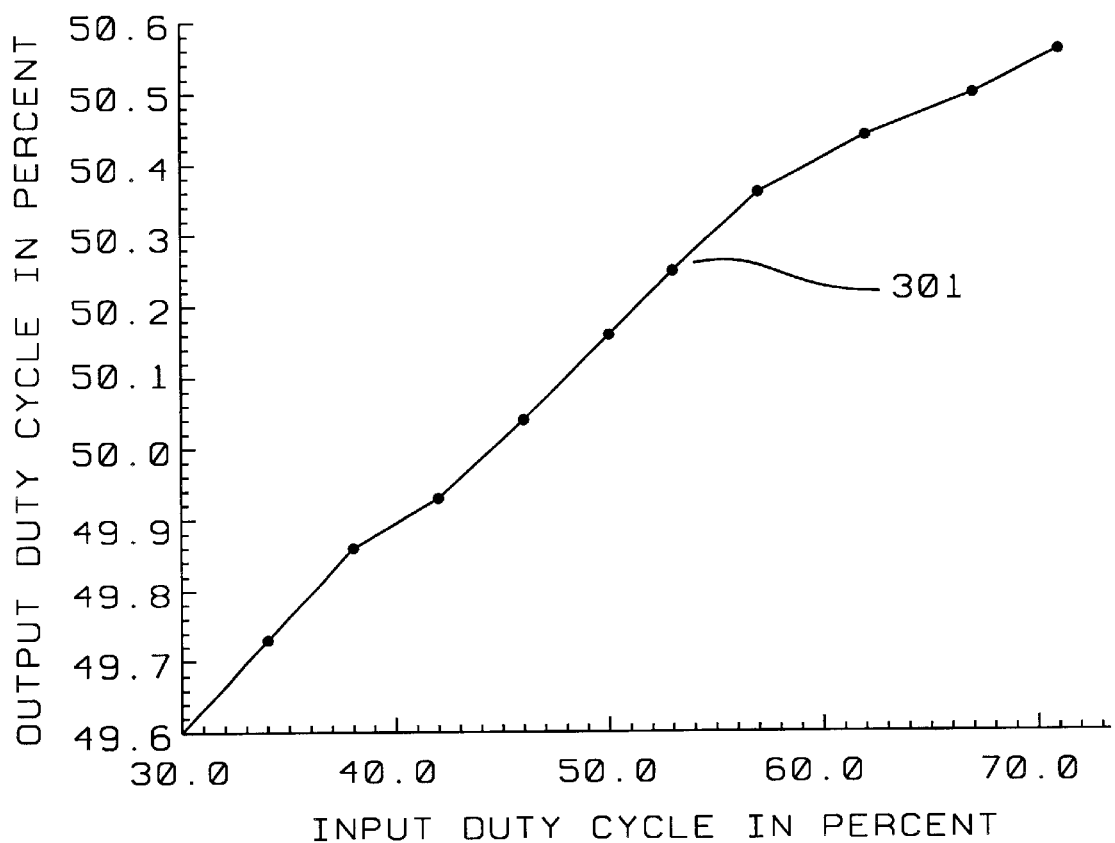
FIG. 4 shows the curve of the output clock signal duty cycle as a function of the input clock signal duty cycle for the circuit of FIG. 3.

FIG. 4 shows simulation results of the circuit of FIG. 3 for an input clock signal having a 10 MHz clock frequency and a duty cycle range from 30% to 70%. Over this range the output clock signal has a duty cycle range from 49.65% to 50.6%.

Those skilled in the art will readily recognize that the circuit block diagram shown in FIG. 1 can be implemented using other circuits than that shown in FIG. 3.

While the invention has been particularly shown and described with reference to the preferred embodiments thereof, it will be understood by those skilled in the art that various changes in form and details may be made without departing from the spirit and scope of the invention.

What is claimed is:

1. A clock duty cycle correction circuit, comprising:
an input node, wherein the voltage between said input node and ground is either at a high voltage level or a low voltage level;
an output node, a first node, a second node, and a reference node;
a first capacitor connected between said first node and said reference node;
a second capacitor connected between said second node and said reference node;
means for charging said first capacitor at a rate which varies inversely with the voltage drop from said second node to said reference node when the voltage between said input node and ground is said low voltage level;
means for discharging said first capacitor at a rate which varies directly with the voltage drop from said second node to said reference node when the voltage between said input node and ground is said high voltage level;
means for producing said low voltage level between said output node and ground when the voltage drop from said first node to said reference node is greater than a threshold voltage and said high voltage level between said output node and ground when the voltage drop from said first node to said reference node is less than said threshold voltage, wherein said means for producing said low voltage level between said output node and ground when the voltage drop from said first node to said reference node is greater than a threshold voltage and said high voltage level between said output node and ground when the voltage drop from said first node to said reference node is less than said threshold voltage comprises an inverter, wherein said inverter is used as a comparator, said inverter comprising a P channel metal oxide semiconductor field effect transistor and an N channel metal oxide semiconductor field effect transistor;
means for charging said second capacitor when the voltage between said output node and ground is said low voltage level; and means for discharging said second capacitor when the voltage between said output node and ground is said high voltage level.

2. The clock duty cycle correction circuit of claim 1, wherein said means for charging said first capacitor comprises a first current source and a first switch connected in series between a voltage supply node and said first node, wherein said first switch is closed and said first current source charges said first capacitor at a rate which varies inversely with the voltage drop from said second node to said reference node when the voltage between said input node and ground is said low voltage level.

3. The clock duty cycle correction circuit of claim 2, wherein said first current source comprises a P channel metal oxide semiconductor field effect transistor having a gate which is connected to said second node.

4. The clock duty cycle correction circuit of claim 2, wherein said first switch comprises a P channel metal oxide semiconductor field effect transistor having a gate which is connected to said input node.

5. The clock duty cycle correction circuit of claim 1, wherein said means for discharging said first capacitor comprises a second current source and a second switch connected in series between said first node and said reference node, wherein said second switch is closed and said second current source discharges said first capacitor at a rate which varies directly with the voltage drop from said second node to said reference node when the voltage between said input node and ground is said high voltage level.

6. The clock duty cycle correction circuit of claim 5, wherein said second current source comprises an N channel metal oxide semiconductor field effect transistor having a gate which is connected to said second node.

7. The clock duty cycle correction circuit of claim 5, wherein said second switch comprises an N channel metal oxide semiconductor field effect transistor having a gate, which is connected to said input node.

8. The clock duty cycle correction circuit of claim 1, wherein said means for charging said second capacitor further comprises a fifth current source and a fifth switch connected in series between a voltage supply node and said second node, wherein said fifth switch is closed when the voltage between said input node and ground is said low voltage level.

9. The clock duty cycle correction circuit of claim 1, wherein said means for discharging said second capacitor further comprises a sixth current source and a sixth switch connected in series between said second node and said reference node, wherein said sixth switch is closed when the voltage between said input node and ground is said high voltage level.

10. A clock duty cycle correction circuit, comprising:
an input node, wherein the voltage between said input node and ground is either at a high voltage level or a low voltage level;
an output node, a first node, and a second node;
a voltage supply node and a reference node;
a first capacitor connected between said first node and said reference node;
a second capacitor connected between said second node and said reference node;
a first current source and a first switch connected in series between said voltage supply node and said first node, wherein said first switch is closed and said first current source charges said first capacitor when the voltage between said input node and ground is said low voltage level;
a second current source and a second switch connected in series between said first node and said reference node, wherein said second switch is closed and said second current source discharges said first capacitor when the voltage between said input node and ground is said high voltage level;
a comparator wherein said comparator comprises an inverter having an input, an output, a P channel metal oxide semiconductor field effect transistor, and an N channel metal oxide semiconductor field effect transistor, wherein said input is connected to said first node and said output is connected to said second node;
a third current source and a third switch connected in series between said voltage supply node and said second node, wherein said third switch is closed and said third current source charges said second capacitor when the voltage between said output node and ground is said low voltage level; and
a fourth current source and a fourth switch connected in series between said second node and said reference node, wherein said second switch is closed and said second current source discharges said second capacitor when the voltage between said output node and ground is said high voltage level.

11. The clock duty cycle correction circuit of claim 10, wherein said first current source comprises a P channel metal oxide semiconductor field effect transistor having a gate which is connected to said second node.

12. The clock duty cycle correction circuit of claim 10, wherein said first switch comprises a P channel metal oxide semiconductor field effect transistor having a gate which is connected to said input node.

13. The clock duty cycle correction circuit of claim 10, wherein said third switch comprises a P channel metal oxide semiconductor field effect transistor having a gate which is connected to said output node.

14. The clock duty cycle correction circuit of claim 10, wherein said second current source comprises an N channel metal oxide semiconductor field effect transistor having a gate which is connected to said second node.

15. The clock duty cycle correction circuit of claim 10, wherein said second switch comprises an N channel metal oxide semiconductor field effect transistor having a gate which is connected to said input node.

16. The clock duty cycle correction circuit of claim 10, wherein said fourth switch comprises an N channel metal oxide semiconductor field effect transistor having a gate which is connected to said output node.

17. The clock duty cycle correction circuit of claim 10, further comprising a fifth current source and a fifth switch connected in series between said voltage supply node and said first node, and means for closing said fifth switch, whereby said fifth current source charges said first capacitor, when the voltage between said input node and ground is said low voltage level.

18. The clock duty cycle correction circuit of claim 10, further comprising a sixth current source and a sixth switch connected in series between said first node and said reference node, and means for closing said sixth switch, whereby said sixth current source discharges said first capacitor, when the voltage between said input node and ground is said high voltage level.

* * * * *